(12) United States Patent
Blecha

(10) Patent No.: US 10,184,291 B2
(45) Date of Patent: Jan. 22, 2019

(54) DOOR FOR CLOSING A CHAMBER OPENING IN A CHAMBER WALL OF A VACUUM CHAMBER

(71) Applicant: VAT Holding AG, Haag (CH)

(72) Inventor: Thomas Blecha, Feldkirch (AT)

(73) Assignee: VAT Holding AG, Haag (CH)

( * ) Notice: Subject to any disclaimer, the term of this patent is extended or adjusted under 35 U.S.C. 154(b) by 0 days.

(21) Appl. No.: 15/536,501

(22) PCT Filed: Dec. 4, 2015

(86) PCT No.: PCT/EP2015/078616
§ 371 (c)(1),
(2) Date: Jun. 15, 2017

(87) PCT Pub. No.: WO2016/096471
PCT Pub. Date: Jun. 23, 2016

(65) Prior Publication Data
US 2017/0328125 A1 Nov. 16, 2017

(30) Foreign Application Priority Data

Dec. 19, 2014 (AT) .................................. A 920/2014

(51) Int. Cl.
*E05F 7/02* (2006.01)
*E06B 5/10* (2006.01)
(Continued)

(52) U.S. Cl.
CPC ............ *E06B 5/10* (2013.01); *E05D 15/0604* (2013.01); *E05D 15/58* (2013.01); *E05F 15/50* (2015.01);
(Continued)

(58) Field of Classification Search
CPC ..... E06B 5/10; E06B 7/22; E06B 7/28; E05D 15/0604; E05D 15/58; E05F 15/50; E05Y 2900/132; H01L 21/67126
(Continued)

(56) References Cited

U.S. PATENT DOCUMENTS 6,056,266 A    5/2000   Blecha
6,095,741 A *   8/2000   Kroeker .................... F16K 3/18
                                               251/193
(Continued)

FOREIGN PATENT DOCUMENTS

CN         103574083       2/2014
CN         103574139       2/2014
(Continued)

*Primary Examiner* — Jerry E Redman
(74) *Attorney, Agent, or Firm* — Volpe and Koenig, P.C.

(57) ABSTRACT

A door for closing a chamber opening in a chamber wall of a vacuum chamber in relation to a surrounding space, in which the vacuum chamber is located, includes a door housing arranged, a closing member arranged in the surrounding space, and a rod, to which the closing member is connected. A first movement of the rod, through which the closing member is displaced from an open position into an intermediate position, occurs as a displacement of the rod in a longitudinal axis direction, and a second movement of the rod subsequent thereto is a displacement at an angle to the longitudinal axis or a pivoting about a pivot axis which is perpendicular to the longitudinal axis from the intermediate position into a closed position. The rod is moveably mounted via the bearing elements, that are arranged in an inner space of the door housing that is sealed with respect to the surrounding space or is connected to the surrounding space via a passage, with a filter, extending through a housing wall of the door housing. The rod is guided out of the inner space in a sealed manner.

9 Claims, 12 Drawing Sheets

(51) Int. Cl.
  *F16K 51/02* (2006.01)
  *F16K 3/18* (2006.01)
  *E05F 15/50* (2015.01)
  *E05D 15/06* (2006.01)
  *E05D 15/58* (2006.01)
  *E06B 7/22* (2006.01)
  *E06B 7/28* (2006.01)
  *H01L 21/67* (2006.01)

(52) U.S. Cl.
  CPC ............... *E06B 7/22* (2013.01); *E06B 7/28* (2013.01); *F16K 3/18* (2013.01); *F16K 51/02* (2013.01); *E05Y 2900/132* (2013.01); *H01L 21/67126* (2013.01)

(58) Field of Classification Search
  USPC .......................................... 49/254, 255, 256
  See application file for complete search history.

(56) References Cited

U.S. PATENT DOCUMENTS

| | | | |
|---|---|---|---|
| 6,237,892 B1 | 5/2001 | Ito | |
| 6,390,448 B1* | 5/2002 | Kroeker | F16K 3/188 251/167 |
| 6,390,449 B1 | 5/2002 | Ishigaki et al. | |
| 6,431,518 B1 | 8/2002 | Geiser | |
| 6,899,316 B2 | 5/2005 | Duelli | |
| 6,916,009 B2 | 7/2005 | Blecha | |
| 7,066,443 B2* | 6/2006 | Ishigaki | F16K 51/02 251/195 |
| 7,500,649 B2* | 3/2009 | Litscher | F16K 3/0254 251/326 |
| 7,611,122 B2 | 11/2009 | Tichy | |
| 8,827,241 B2 | 9/2014 | Geiser et al. | |
| 8,960,641 B2* | 2/2015 | Blecha | F16K 3/18 251/158 |
| 9,086,173 B2 | 7/2015 | Ehrne | |
| 9,429,239 B2 | 8/2016 | Jee | |
| 9,765,897 B2* | 9/2017 | Jee | F16K 3/184 |
| 9,957,745 B2* | 5/2018 | Ehrne | E05F 15/57 |
| 2003/0136343 A1* | 7/2003 | Tsung-Lin | C23C 14/564 118/715 |
| 2004/0245489 A1* | 12/2004 | Kurita | F16K 3/188 251/195 |
| 2005/0269334 A1* | 12/2005 | Bang | H01L 21/67126 220/581 |
| 2007/0272888 A1* | 11/2007 | Tichy | F16K 3/18 251/63 |
| 2010/0090145 A1 | 4/2010 | Maerk | |
| 2010/0219362 A1* | 9/2010 | Duelli | F16K 3/186 251/195 |
| 2011/0089354 A1* | 4/2011 | Nagao | F16K 3/184 251/229 |
| 2011/0175011 A1 | 7/2011 | Ehme et al. | |
| 2012/0298899 A1* | 11/2012 | Geiser | F16K 3/188 251/158 |
| 2013/0112906 A1* | 5/2013 | Ishigaki | F16K 3/16 251/328 |
| 2013/0153806 A1* | 6/2013 | Choi | H01L 21/67126 251/319 |
| 2013/0309047 A1* | 11/2013 | Wakabayashi | H01L 21/67126 414/217 |
| 2014/0003892 A1* | 1/2014 | Yamamoto | F16K 51/02 414/217 |
| 2014/0131603 A1 | 5/2014 | Blecha | |
| 2014/0183391 A1 | 7/2014 | Blecha | |
| 2015/0014556 A1* | 1/2015 | Ishigaki | F16K 51/02 251/12 |
| 2015/0316155 A1* | 11/2015 | Ishigaki | F16K 27/044 251/328 |
| 2015/0345660 A1* | 12/2015 | Kho | F16K 47/00 251/326 |
| 2016/0305555 A1* | 10/2016 | Jee | F16K 3/184 |

FOREIGN PATENT DOCUMENTS

| | | |
|---|---|---|
| CN | 104204635 | 12/2014 |
| DE | 19633798 | 2/1998 |
| DE | 60012428 | 7/2005 |
| DE | 102008051349 | 11/2009 |
| EP | 2749798 | 7/2014 |
| WO | 2011091455 | 8/2011 |
| WO | WO-2015139818 A1 * 9/2015 ....... H01L 21/67126 |

* cited by examiner

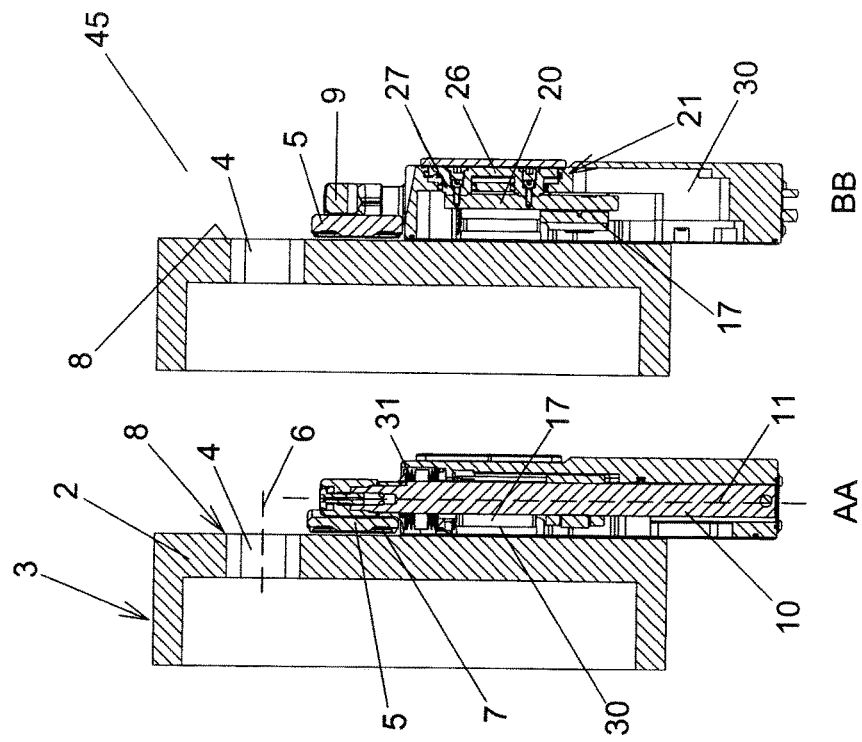
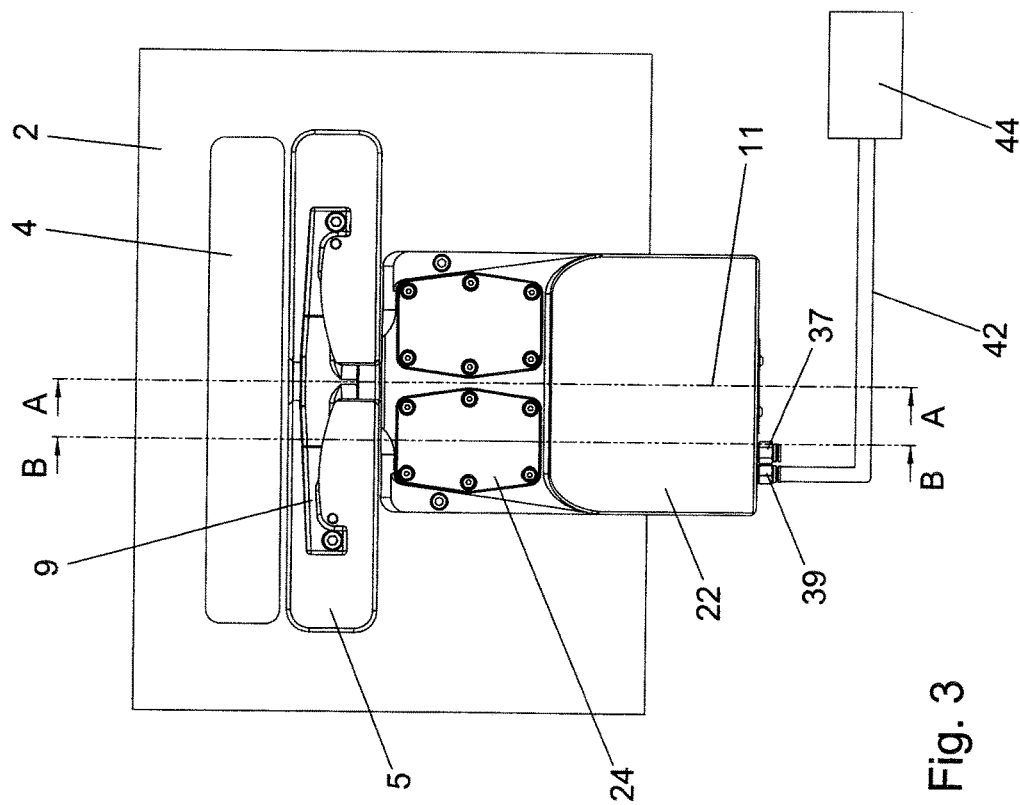

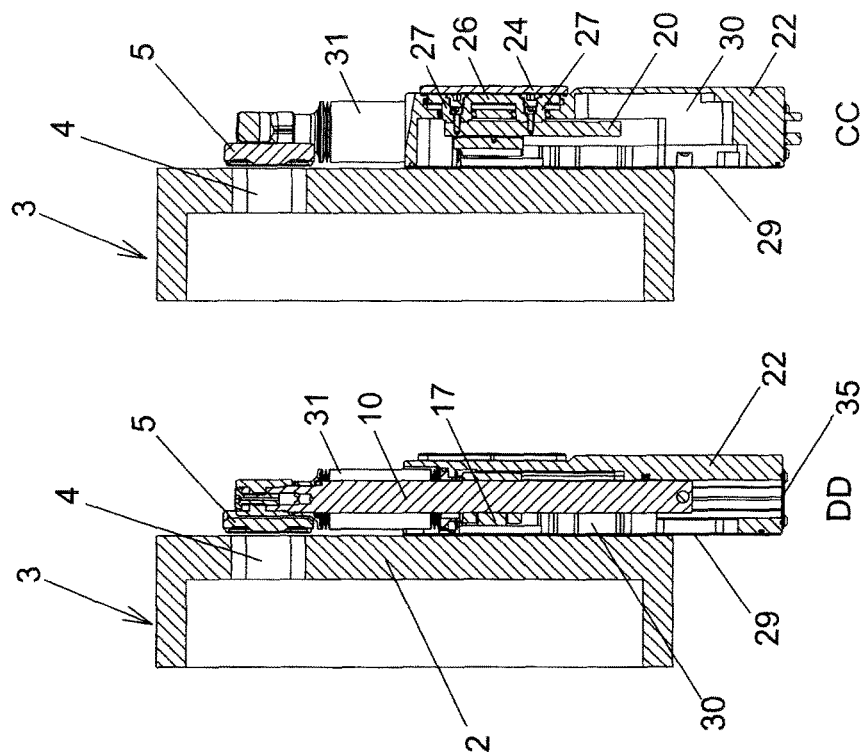
Fig. 8
Fig. 7
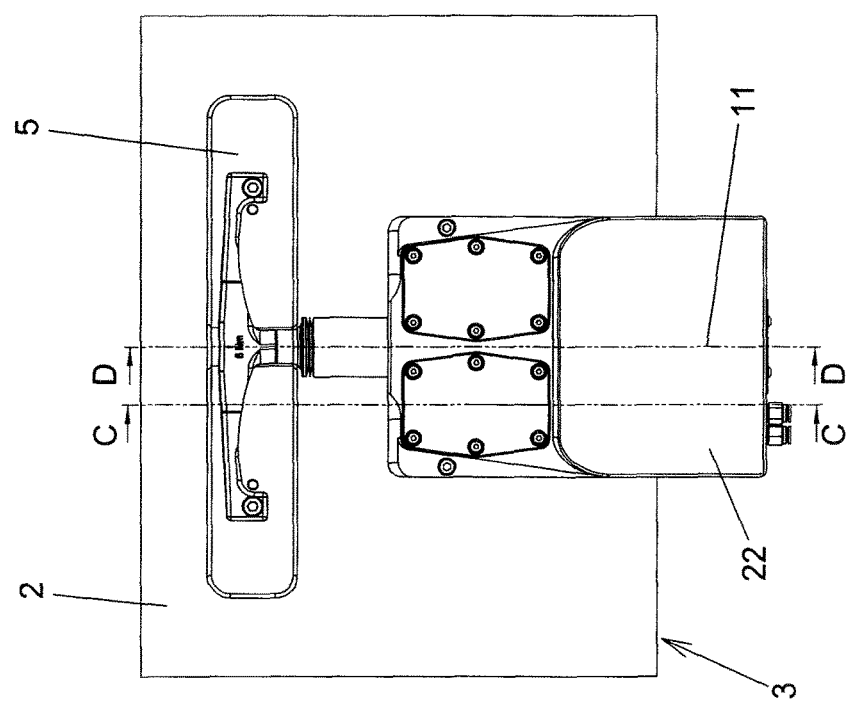
Fig. 6

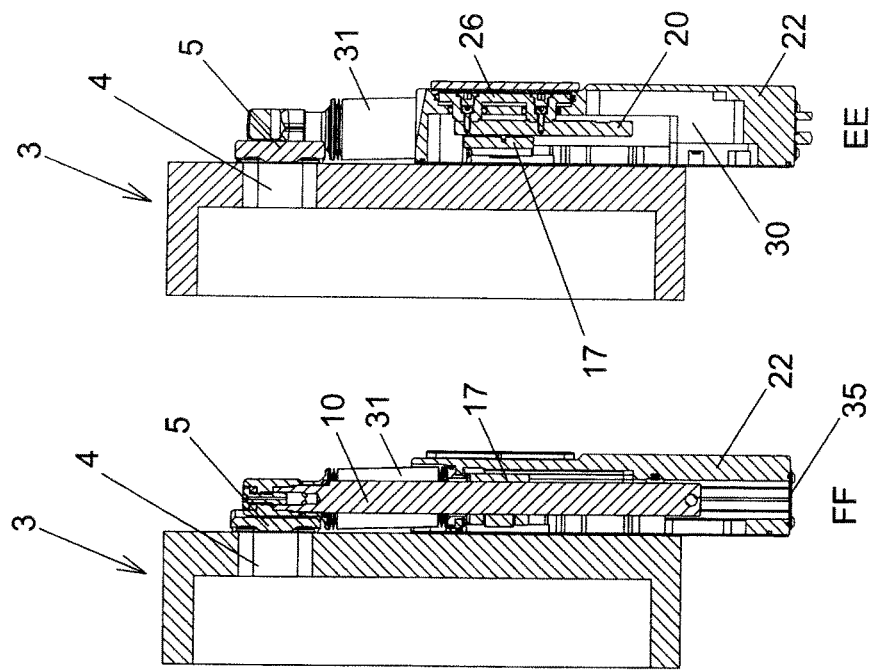
Fig. 11
Fig. 10
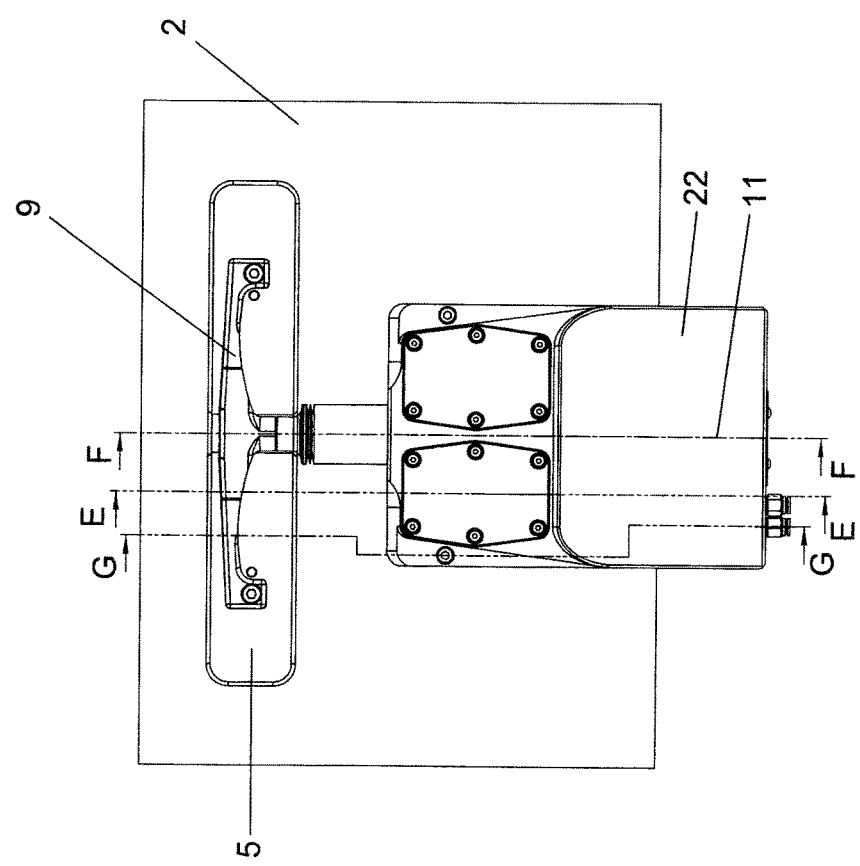
Fig. 9

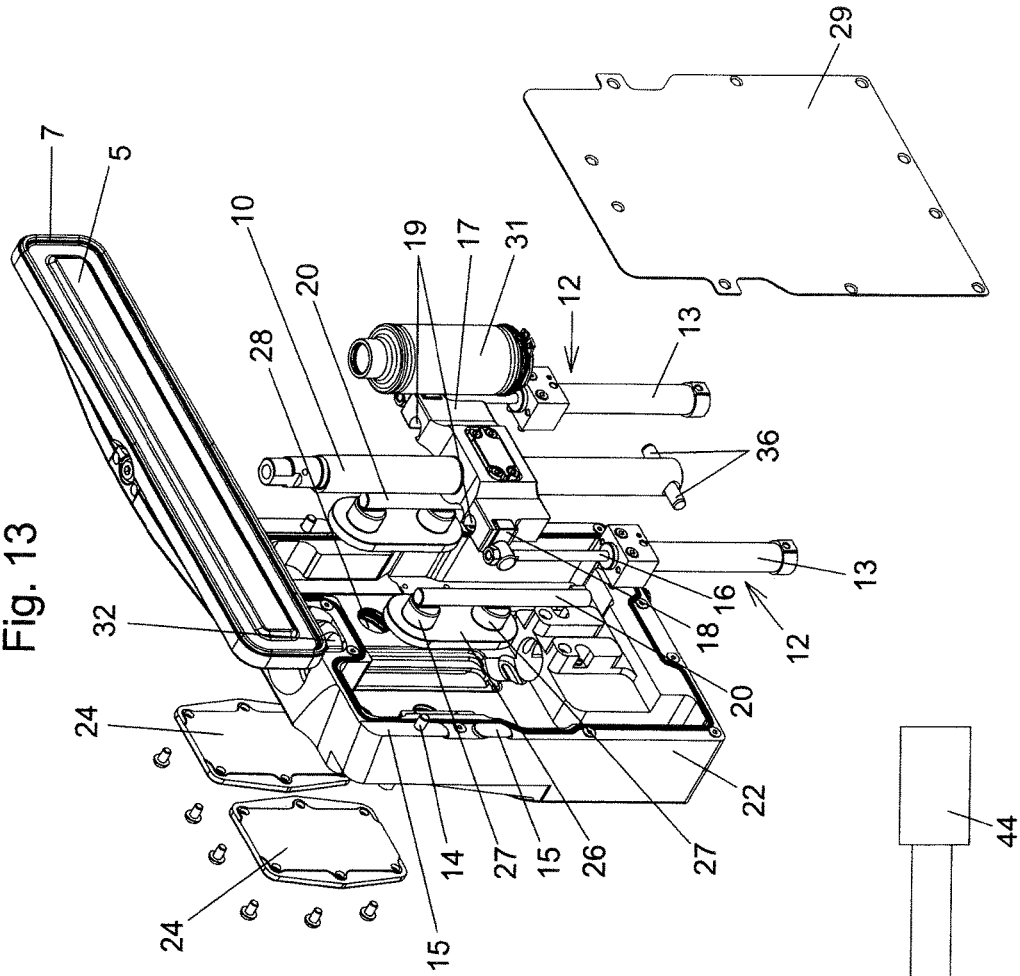
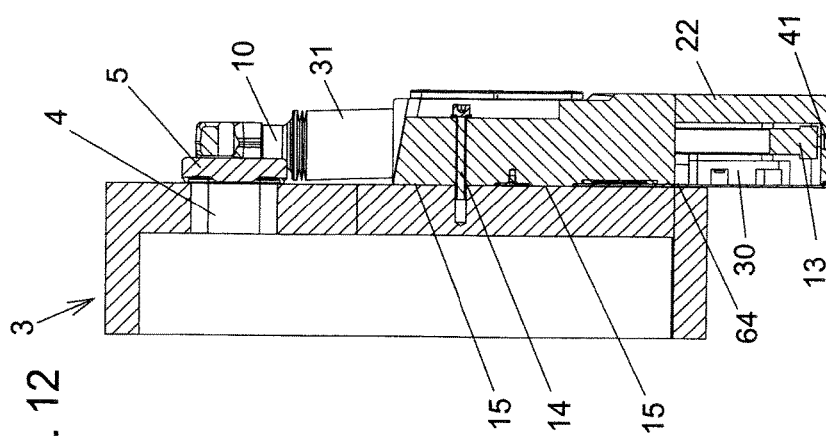
Fig. 13
Fig. 12

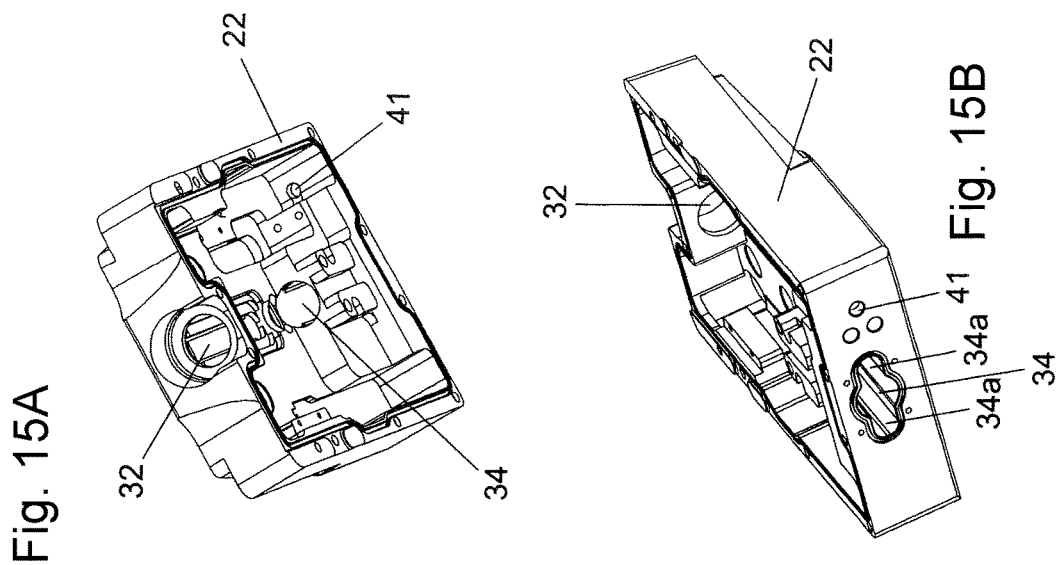
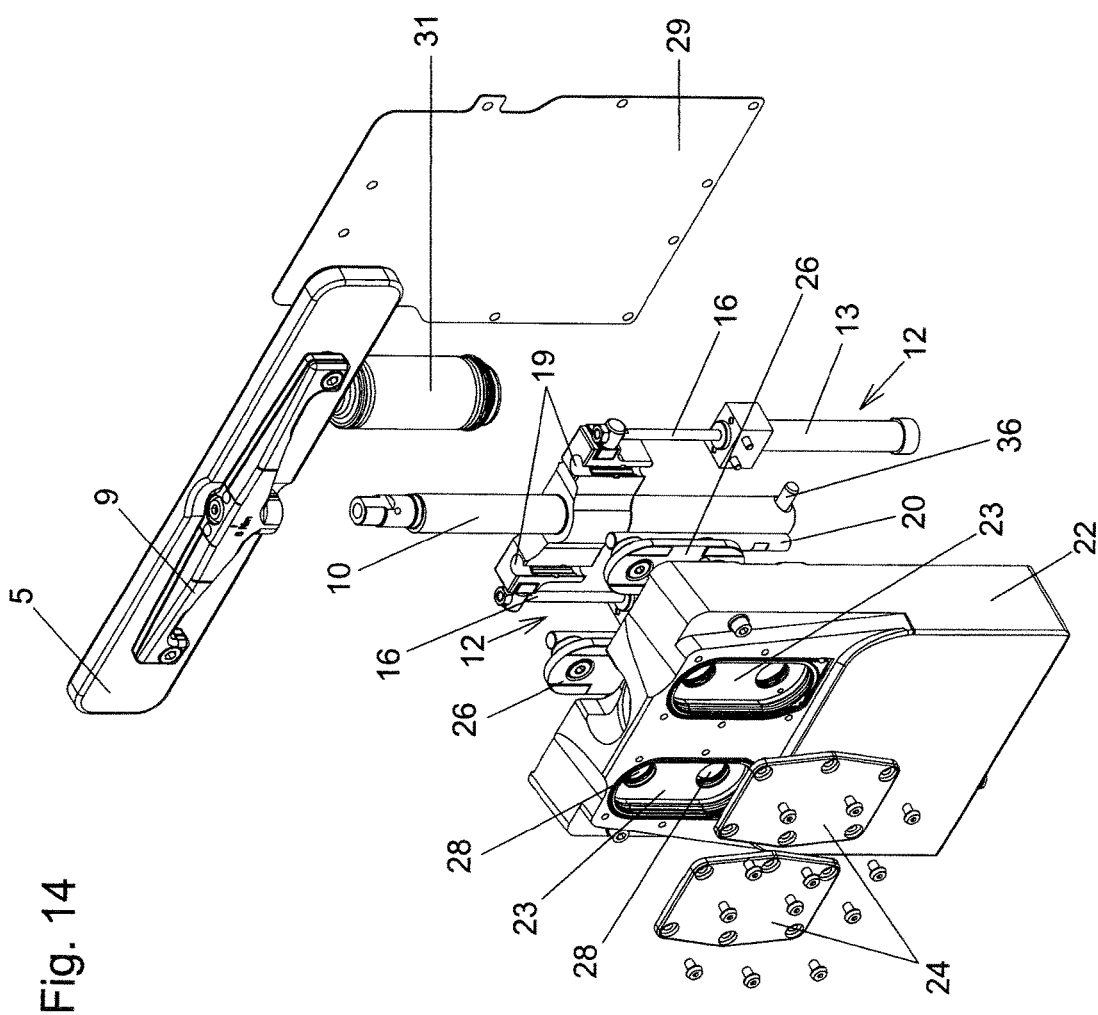

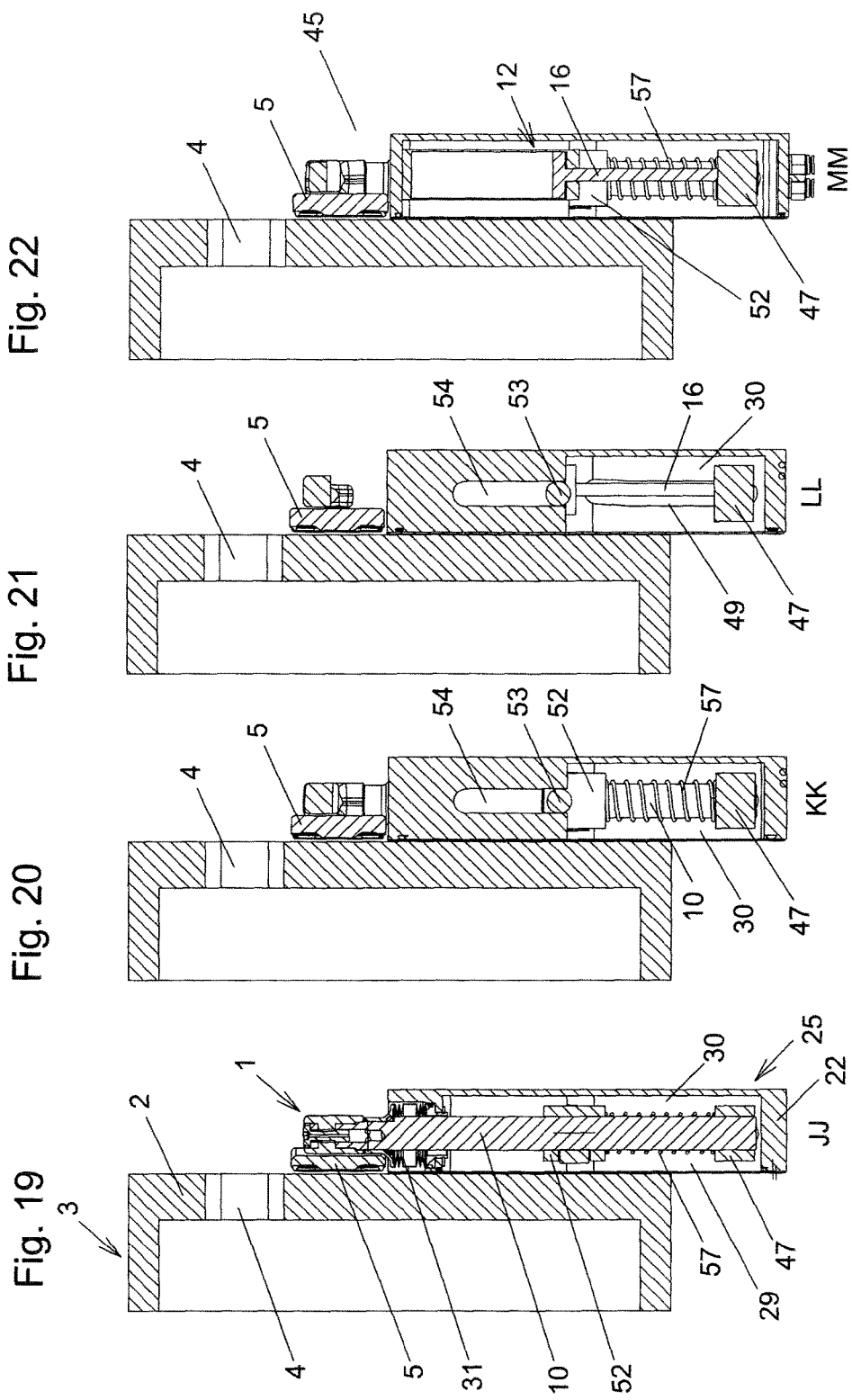

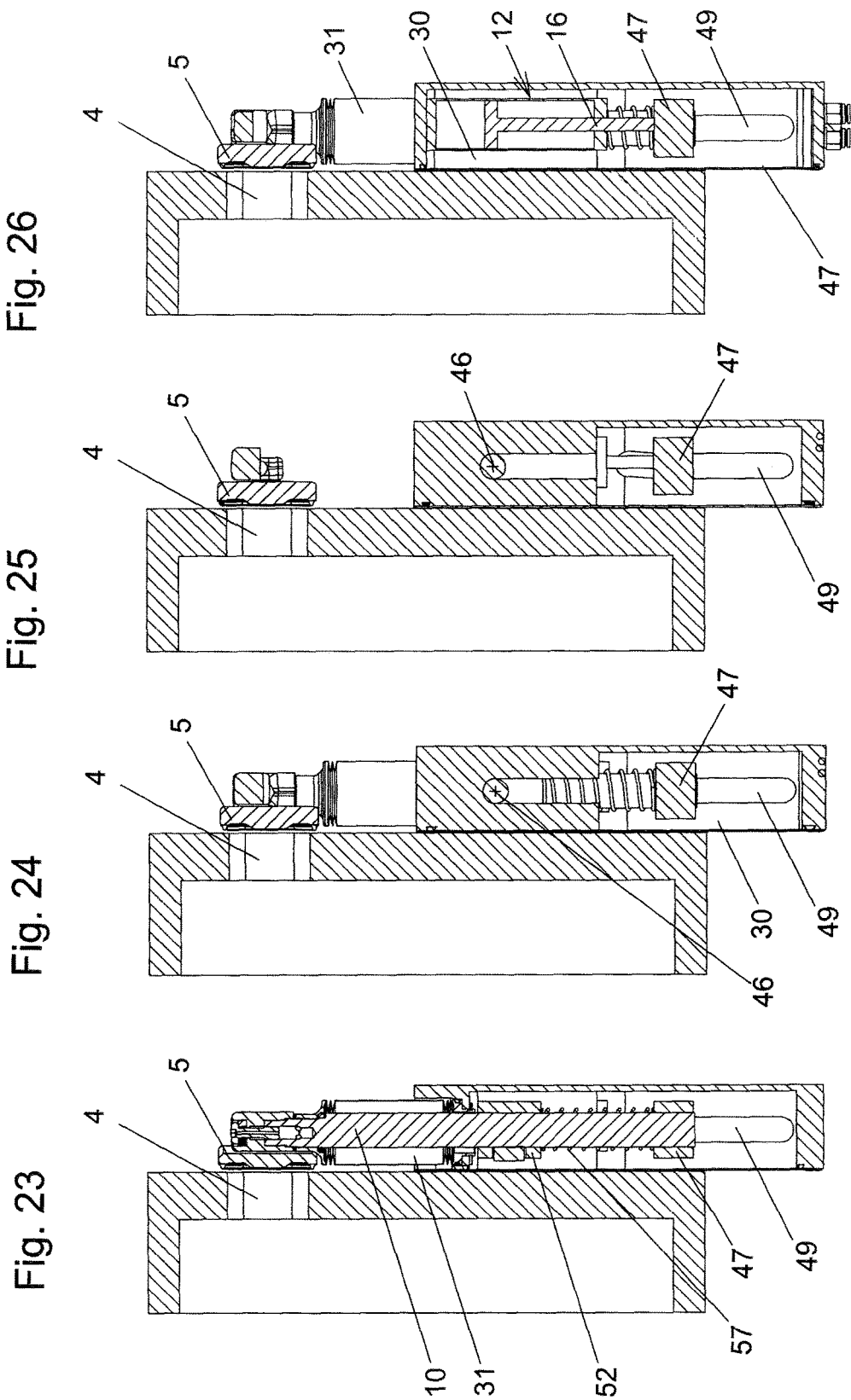

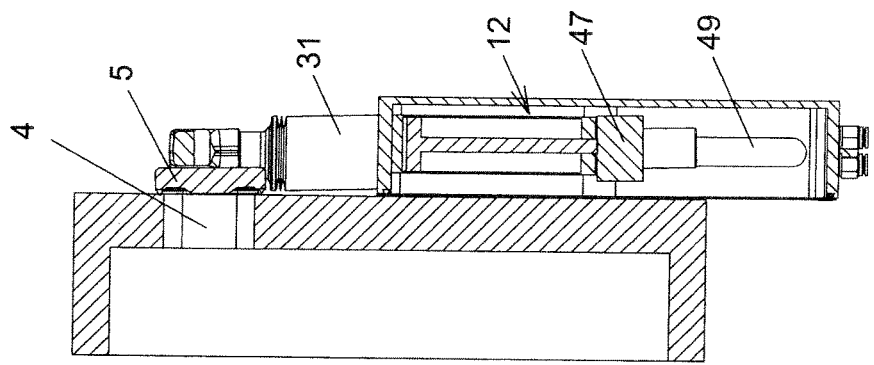
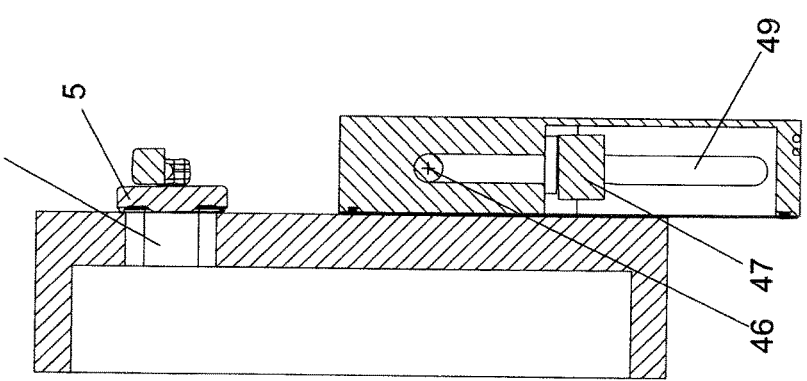
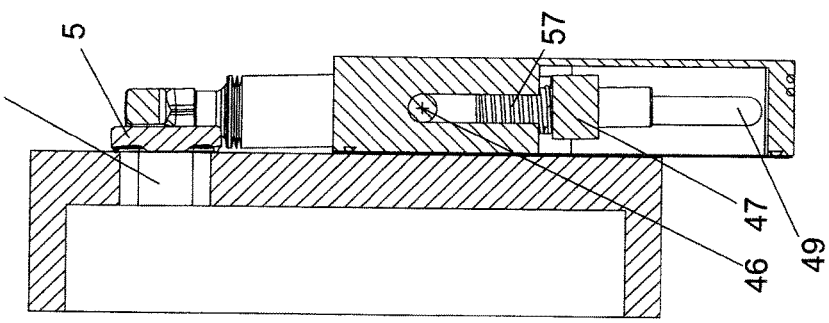
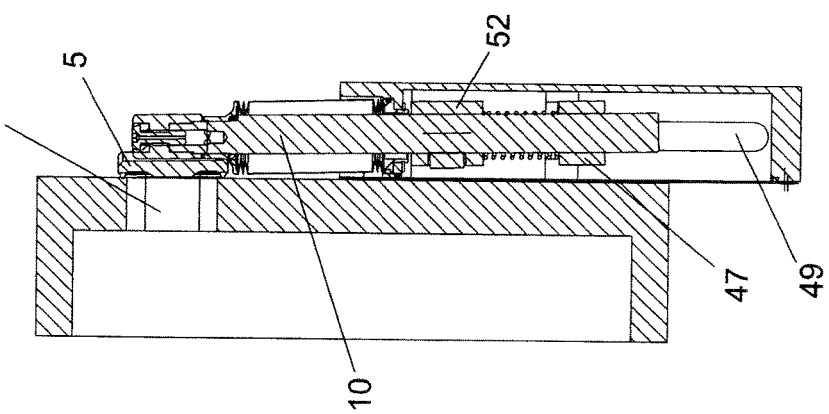

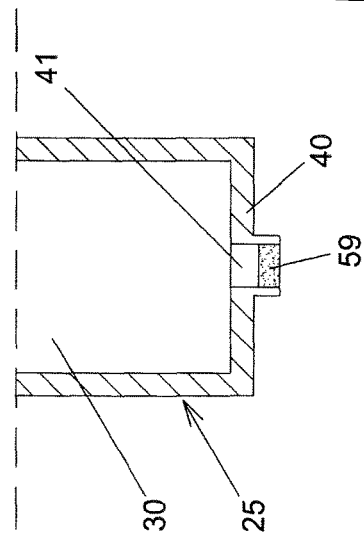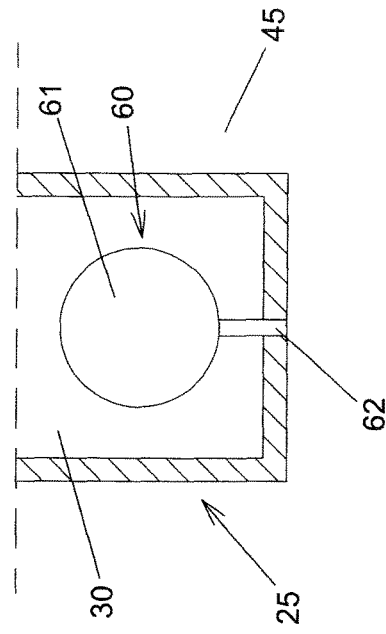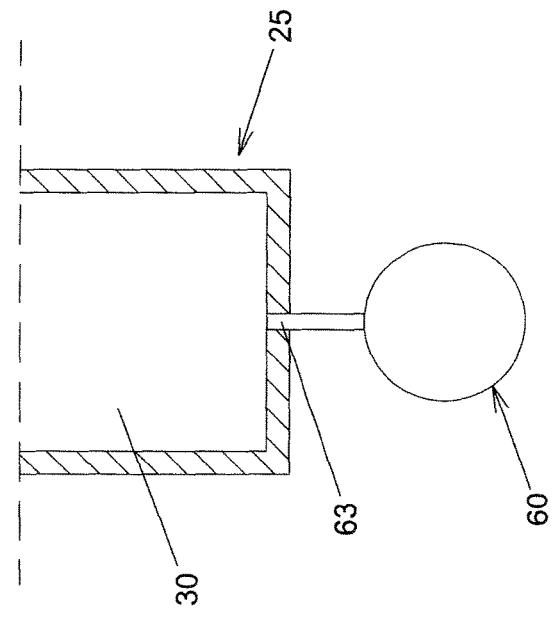

DOOR FOR CLOSING A CHAMBER OPENING IN A CHAMBER WALL OF A VACUUM CHAMBER

BACKGROUND

The invention relates to a door for closing a chamber opening in a chamber wall of a vacuum chamber in relation to a surrounding space, in which the vacuum chamber is located, comprising a door housing arranged in the surrounding space, a closure member which is arranged in the surrounding space and is adjustable over an adjustment path from an open position for opening up the chamber opening into a closed position for closing the chamber opening, and a rod which has a longitudinal axis and to which the closure member is connected, wherein the closure member is adjusted over the adjustment path by a first movement of the rod and a subsequent second movement of the rod, and the first movement of the rod, by which the closure member is adjusted from the open position into an intermediate position, is a displacement of the rod in the direction of its longitudinal axis, and the subsequent second movement of the rod, by which the closure member is adjusted from the intermediate position into the closed position, is a displacement of the rod in a direction at an angle to its longitudinal axis and/or a pivoting of the rod about a pivot axis which is at a right angle to its longitudinal axis.

Doors of vacuum chambers serve, in the closed state of the door, to seal a chamber opening in the chamber wall of a vacuum chamber in relation to the surrounding atmosphere in order to maintain a vacuum in the vacuum chamber. In the open state of the door, it is possible, for example, for substrates to be processed to be introduced into the vacuum chamber through the opening.

In the case of important regions of use, in which processes are carried out under vacuum conditions, for example in semiconductor technology or coating technology, for example for producing screens, clean room conditions have to prevail in the space surrounding the vacuum chamber. The substrates to be processed are thereby protected against accumulations of harmful dirt particles.

Particles which are formed during the operation of the door and are released into the surroundings may be a problem here. Of a particularly critical nature is the release of particles here specifically in the region through which the substrates are introduced into the vacuum chamber.

Vacuum doors of the type mentioned at the beginning with a substantially L-shaped adjustment path of the closure member during the closing of the door are known from DE 19 633 798 A1, WO 2011/091455 A1 and U.S. Pat. No. 7,611,122 B2. The closing of the door from its open position takes place here by the fact that the rod to which the closure member is attached is initially displaced axially (=first movement of the rod) and, as a result, pivoting of the rod about a pivot axis which is at right angles to its longitudinal axis takes place (=second movement of the rod). For the first movement of the rod, the latter is mounted displaceably in relation to a basic body of the door. For the second movement of the rod, the basic body is pivotable about the pivot axis in relation to the chamber wall of the vacuum chamber. For pivoting the basic body about the longitudinal axis, piston-cylinder units are provided in the document mentioned first, the pistons of which are supported on the chamber wall on both sides of the pivot axis. In the document mentioned second, tubular, inflatable elements are arranged as actuators on both sides of the pivot axis. Simply designed and cost-effective doors can be provided in this manner; however, a large amount of particles are generated during the operation.

U.S. Pat. No. 6,056,266 discloses a door in which the door housing is attached rigidly to the chamber wall. A rod is displaceable axially by a piston-cylinder unit. A support unit which forms a cylinder space of a transverse piston-cylinder unit is attached to the rod. The closure member is attached to the piston rod of said transverse piston-cylinder unit. Overall, an L-shaped movement of the closure member is therefore again carried out. By actuation of the piston-cylinder units, of which the transverse piston-cylinder units also lie directly in front of the chamber opening, a high particle loading also occurs in the case of this door. A similar door is also known from U.S. Pat. No. 6,899,316 B2.

A door in which a reduced particle loading for substrates introduced through the chamber opening of a sluice chamber is intended to be achieved is revealed in U.S. Pat. No. 6,916,009 B2. The closure member is moved from its open position via an L-shaped adjustment path into its closed position in which it seals the opening in the chamber wall. To adjust the closure member from its open position into an intermediate position, first and second longitudinal piston-cylinder units are provided which are each attached to a housing part and displace rods to which the closure member is connected. In order to adjust the closure member from its intermediate position into the closed position, the housing parts are adjusted in relation to the chamber wall of the sluice chamber by transverse piston-cylinder units. The closure member is connected to the rods via connecting pieces which are at right angles to the rods and protrude through elongated holes in a cover plate. A filtered airflow is guided past the cover plate. Although an improvement in the particle loading in comparison to previously known designs of doors is achieved by this design, this particle loading may still be too high for sensitive uses.

L-shaped movements of closure members are known in different ways in the case of valves which serve for providing a seal between two vacuum chambers or a vacuum chamber and a pipe. The closure members are in each case arranged here in the interior of a valve housing and, in their closed position, seal a valve opening of the valve housing. The interior space of the valve housing in which the closure member is arranged constitutes a vacuum region here and, in the open state of the vacuum valve, forms a passageway through the vacuum valve. Examples of L valves, in which, during the closing of the vacuum valve, first of all an axial displacement of the valve rod takes place and, as a consequence, a displacement which is at right angles thereto takes place, are found in US 2014/0131603 A1 and US 2011/0175011 A1. Vacuum valves with at least substantially L-shaped movements of the closure member, in which, subsequent to an axial displacement of the valve rod, tilting of the valve rod about an axis which is at right angles to the longitudinal axis of the valve rod takes place, are revealed, for example, in U.S. Pat. No. 6,431,518 B1 and U.S. Pat. No. 6,237,892 B1.

SUMMARY

It is the object of the invention to provide an advantageous door of the type mentioned at the beginning which is distinguished by a very low production of released particles by the opening and closing of the door. This is achieved by a door with one or more features of the invention.

In the case of the door according to the invention, the rod is mounted movably over its first movement and over its second movement in relation to a door housing by means of bearing elements. Said bearing elements are arranged in the interior space of the door housing. The interior space of the door housing is sealed here in relation to a surrounding space, in which the door housing is located, or is connected to the surrounding space via a passage which passes through a housing wall of the door housing and in which a particle filter is arranged. The rod is guided in a sealed manner out of the interior space of the door housing into the surrounding space in which the closure member is located.

For the case in which the interior space of the door housing is sealed in relation to the surrounding space in which the door housing is located, it can be provided, in a possible embodiment, that the interior space of the door housing is completely sealed, and an expansion vessel with an inner expansion space, the volume of which is changeable, is arranged in the interior space of the door housing. In this connection, by a change in the volume of the expansion space, changes in the volume of the free region of the interior space of the door housing, which changes occur during the adjustment of the closure member between the open position and the closed position, can be compensated for, and therefore the internal pressure in the interior space of the door housing does not change too greatly, preferably by less than 20%, during the adjustment of the closure member between the open position and the closed position.

In another possible embodiment, the expansion vessel could also be arranged in the surrounding space in which the door housing is located, wherein the expansion space of the expansion vessel, the volume of which is changeable, communicates with the interior space of the door housing via a passage passing through a housing wall of the door housing.

A further possible embodiment provides that the interior space of the door housing is sealed in relation to the surrounding space and is evacuated here via a passage passing through a housing wall of the door housing. For the evacuation, use can be made of a backup pump which is present in any case in a vacuum installation.

According to a further design possibility, the interior space of the door housing could also be connected via a passage passing through a housing wall of the door housing to an exterior space which is separate from the surrounding space in which the door housing is located. The exterior space therefore advantageously lies outside the clean room in which the vacuum chamber, to which the door is attached, is located. Also as a result, the interior space of the door housing can be sealed in relation to the surrounding space (which is formed by the clean room) surrounding the door housing.

An advantageous embodiment of a door according to the invention provides that at least one pneumatic piston-cylinder unit together with a piston rod of the piston-cylinder unit, the piston rod projecting out of the cylinder, is completely arranged in the interior space of the door housing, i.e. the piston rod is located over its entire length in the interior of the door housing and is not guided out of said door housing by an opening thereof, for example. This at least one pneumatic piston-cylinder unit serves here for moving the rod, to which the closure member is connected, in order to move the closure member at least over a portion of its adjustment path. All of the pneumatic piston-cylinder units which serve for moving the closure member over the adjustment path are preferably arranged together with their piston rods completely in the interior space of the door housing.

For the sealed guiding of the rod out of the interior space of the door housing into the surrounding space, a bellows, preferably an expansion bellows, in particular in the form of a diaphragm bellows, or a corrugated bellows, is preferably provided.

By use of the invention, a door having very low particle production can be provided, the door meeting even very stringent requirements of clean room conditions. A door according to the invention can also be formed here in a relatively simple manner.

BRIEF DESCRIPTION OF THE DRAWINGS

Further advantages and features of the invention are explained below with reference to the attached drawing, in which:

FIG. 3 shows a view of the door attached to the chamber wall;

FIGS. 4 and 5 show sections along the lines AA and BB of FIG. 3;

FIG. 6 shows a view analogously to FIG. 3, but in an intermediate position of the closure member;

FIGS. 7 and 8 show sections along the line of CC and DD of FIG. 6;

FIG. 9 shows a view analogously to FIG. 3, but in the closed state of the door;

FIGS. 10, 11 and 12 show sections along the lines EE, FF and GG;

FIGS. 13 and 14 show exploded illustrations of the door from various viewing directions;

FIGS. 15A and 15B show perspective views of a housing part of the door housing from various viewing directions;

FIGS. 17 to 22 show sections along the lines HH, II, JJ, KK, LL and MM from FIG. 16;

FIGS. 23 to 26 show sections analogously to FIGS. 19 to 22, but in the intermediate position of the closure member;

FIGS. 27 to 30 show sections analogously to FIGS. 19 to 22, but in the closed state of the door;

FIGS. 32 to 35 show schematic illustrations of further variant embodiments.

DETAILED DESCRIPTION OF THE PREFERRED EMBODIMENTS

Figure 1:
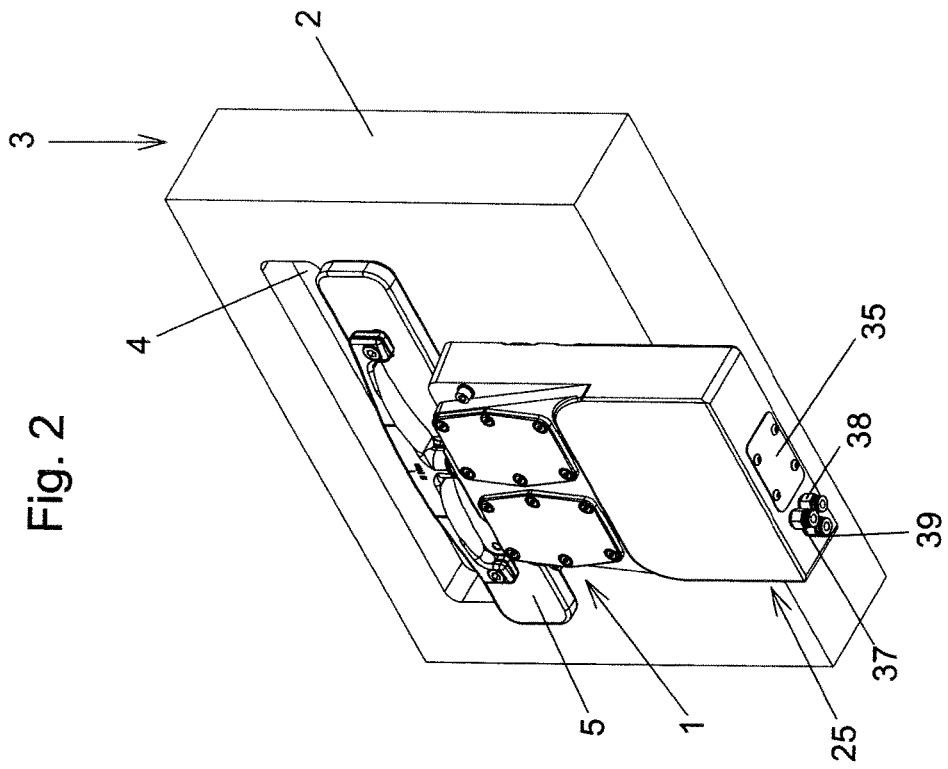
FIG. 1 shows a perspective view of a door which is attached to a chamber wall of a vacuum chamber and is in the open state, according to a first exemplary embodiment of the invention.
Figure 2:
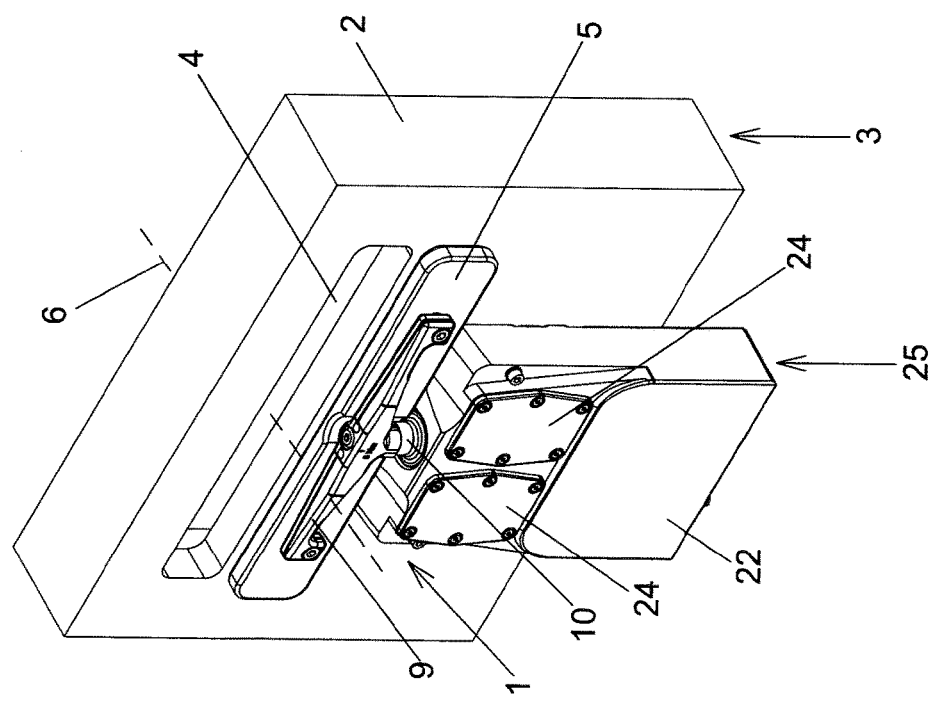
FIG. 2 shows a perspective view of the door attached to the chamber wall, from a viewing angle which is changed in relation to FIG. 1.
Figure 17:
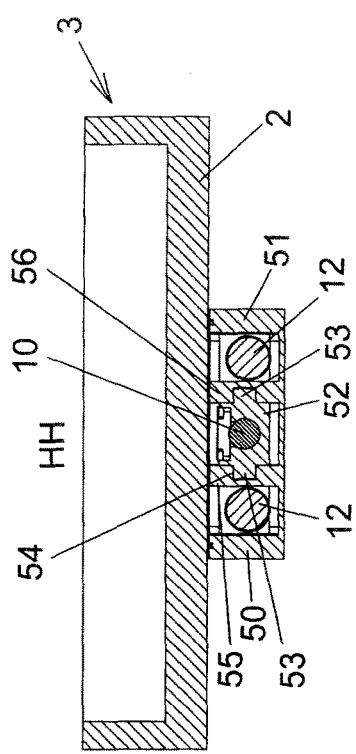
Figure 18:
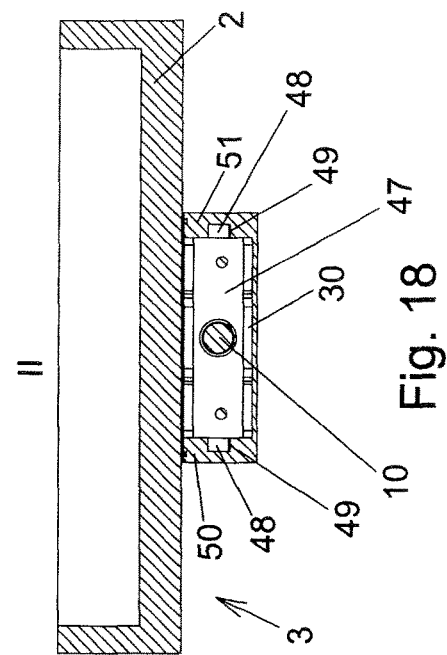
Figure 16:
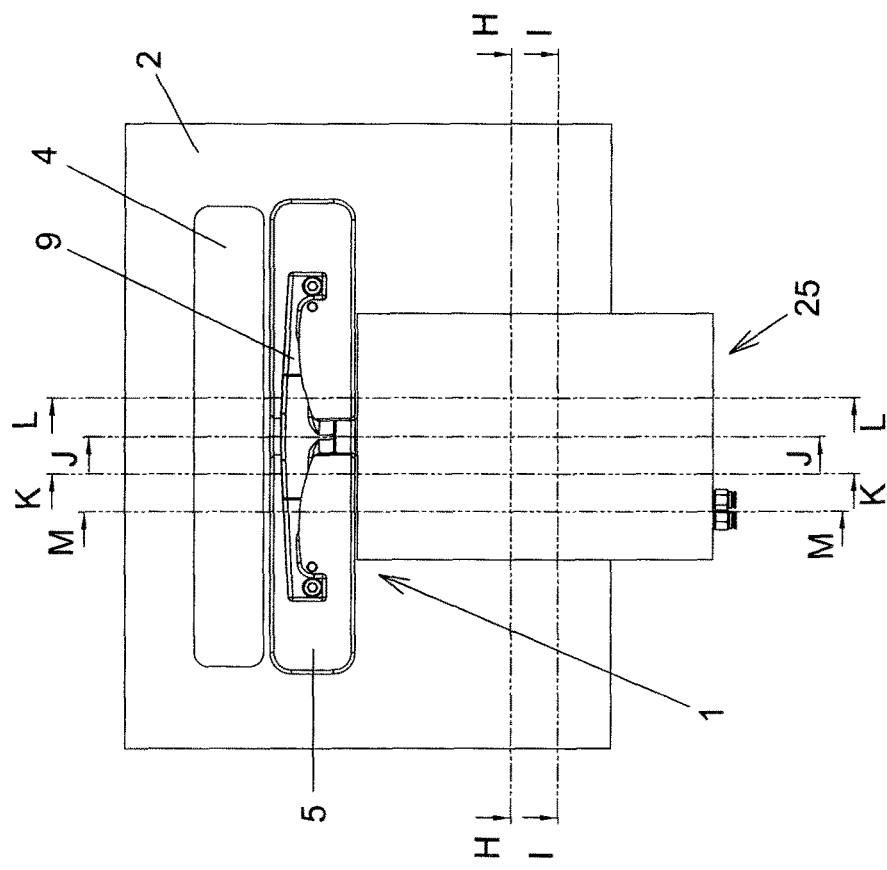
FIG. 16 shows a view of a door attached to a chamber wall, according to a second exemplary embodiment of the invention.

A first exemplary embodiment of a door according to the invention is illustrated in FIGS. 1 to 15. The door 1 which may also be referred to as a vacuum door, is attached to a chamber wall 2, of which only a portion is illustrated, of a vacuum chamber 3. The chamber wall 2 has a chamber opening 4 which, in the closed state of the door 1, is closed in a vacuum-tight manner by the closure member 5 of the door. In the opened state of the door 1, the chamber opening 4 is opened up, i.e. the closure member 5 does not cover the chamber opening 4, as seen in the direction of the longitudinal center axis 6 of the chamber opening 4.

The door 1 is attached to the outside of the vacuum chamber 3, i.e. the door 1 is located in the surrounding space 45 surrounding the vacuum chamber 3. Atmospheric pressure prevails in said surrounding space.

In the opened state of the door 1, the closure member 5 arranged outside the vacuum chamber 3 takes up its open position, cf. FIGS. 1-8. In the closed state of the door 1, the closure member 5 takes up its closed position, cf. FIGS. 9-12, in which said closure member is pressed against the outer side of the chamber wall 2. In the closed position of the closure member 5, a circumferentially closed elastic seal 7, which is attached to the closure member 5, is pressed against a sealing face 8 of the chamber wall 2. The sealing face 8 surrounds the chamber opening 4. The seal 7 and the sealing face 8 are therefore of ring-shaped design, but not of circular-ring-shaped design in the exemplary embodiment. However, circular-ring-shaped designs are conceivable and possible in particular in the case of circular contours of the chamber opening 4 and of the closure member 5. The sealing face 8 is located on the outer side of the chamber wall 2, which outer side is adjacent to the surrounding space 45. In a modified design, the seal 7 could also be attached to the chamber wall 2 and could surround the chamber opening 4 and abut against a sealing face of the closure member 5 in the closed state of the door 1. The seal would therefore be attached here to the outer side of the chamber wall 2, which outer side is adjacent to the surrounding space 45.

The door 1 is fastened to the chamber wall 2 by fastening of the door housing 25 to the chamber wall 2.

The closure member 5 is adjusted from the open position into the closed position and back in each case via an intermediate position which is illustrated in FIGS. 6-8. In the intermediate position, the closure member 5 covers the chamber opening 4, as seen in the direction of the longitudinal center axis 6 of the chamber opening 4, but the seal 7 is still spaced apart from the sealing face 8.

The closure member 5 is attached to a rod 10 via a connecting piece 9. The closure member 5 is adjusted between the open position and closed position by a movement of the rod 10. For the adjustment of the closure member between its open position and its intermediate position, the rod 10 is displaced here linearly axially, i.e. in the direction of its longitudinal axis 11 (=displaced rectilinearly in parallel). For the adjustment of the closure member 5 between the intermediate position and the closed position, the rod 10 in this exemplary embodiment is displaced linearly at right angles to its longitudinal axis 11 (=displaced rectilinearly in parallel) in order to guide the closure member 5 in the direction of the longitudinal center axis 6 of the chamber opening 4 up to the chamber wall 2 having the chamber opening 4 until the seal 7 is pressed against the sealing face 8. Thus, overall, an L movement of the closure member 5 is carried out.

Although a displacement at right angles to the longitudinal axis 11 of the rod 10 is advantageous in order to displace the closure member 5 from the intermediate position into the closed position, angles ≠90° are also conceivable and possible, with the deviation from 90° preferably being less than 45°. The direction of the displacement therefore deviates by a corresponding angle from the parallel position to the longitudinal center axis 6 of the chamber opening 4. The direction of the parallel displacement can also change here over the adjustment path of the closure member 5 between the intermediate position and the closed position. Such movements of the closure member 5, in which the adjustment between the intermediate position and the closed position takes place at an angle deviating from 90°, are also referred to as a "J movement" of the closure member. According to a further possible design, the adjustment of the closure member between the intermediate and the closed position can also take place by pivoting of the rod 10 about a pivot axis which is at right angles to the longitudinal axis 11 of the rod 10 and is at right angles to the longitudinal center axis 6 of the chamber opening 4, as is explained more precisely further below in conjunction with a second exemplary embodiment of the invention. A combination of a parallel displacement of the rod 10 at an angle to its longitudinal axis 11 and pivoting of the rod 10 about a pivot axis which is at right angles to its longitudinal axis 11 is also conceivable and possible. An at least substantially L-shaped movement of the closure element 5 can also be achieved as a result.

The closure member is therefore adjusted from the open position to the closed position by a first movement of the rod 10, in which the rod 10 is displaced axially, and a subsequent second movement of the rod 10, in which the rod is displaced in a direction at an angle, for example right angle, to its longitudinal axis 11 and/or is pivoted about a pivot axis which is at a right angle to its longitudinal axis. During the adjustment of the closure member from the closed position into the open position, the two movements of the rod 10 take place in the reverse sequence and in the reverse direction.

For the axial displacement of the rod 10, in order to carry out the first movement of the rod 10 (and therefore the displacement of the closure member between the open position and the intermediate position), pneumatically acting piston-cylinder units, which are referred to below as longitudinal piston-cylinder units 12, serve as drives. The longitudinal piston-cylinder units 12 each have a cylinder 13 with a cylinder space and a piston arranged in the cylinder space.

The piston rods 16 of the longitudinal piston-cylinder units 12 are connected movably to a transmission piece 17, which is connected rigidly in all directions to the rod 10, in a non-displaceable manner with respect to the direction of the longitudinal axis 11 of the rod 10 (i.e. rigidly with respect to this direction) and at an angle, at a right angle in the exemplary embodiment, with respect to that direction to the longitudinal axis 11 of the rod 10 in which the second movement of the rod 10 takes place. For this purpose, the piston rods 16 are attached to connecting parts 18 which are displaceable in the manner of slides in the direction of the second movement of the rod 10 in relation to the transmission piece 17.

The transmission piece 17 has recesses 19 in which guide rods 20 are arranged. In the exemplary embodiment, the recesses 19 are of partially cylindrical design and are open toward the edge of the transmission piece 17 and surround the cross-sectionally circular guide rods 20, which are arranged in said recesses, over more than 180° of the circumference of the guide rods 20. As a result, the transmission piece 17 is held in a displaceable manner in relation to the guide rods 20 in the direction of the longitudinal axis 11 of the rod 10, but is held in a non-displaceable manner in relation to the guide rods 20 with respect to the direction of the second movement of the rod 10. Instead of the recesses 19 which are shown, dovetail-like recesses, for example, could also be provided, in which guide rod strips of undercut design are arranged.

The cylinders 13 are rigidly connected to a housing part 22 of the door housing 25, which is described more precisely further below.

A different connection than the movable connection shown, between the piston rods 16 and the rod 10, is also conceivable and possible. A reverse arrangement, in which the cylinders 13 are connected to the piston rod 16 and the pistons are connected to the door housing 25, is also conceivable and possible. Instead of two longitudinal piston-cylinder units 12, basically only one longitudinal piston-cylinder unit 12 could be provided, whereas more than two longitudinal piston-cylinder units 12 could be provided.

For the displacement of the rod 10 in a direction at an angle, preferably at a right angle, to its longitudinal axis 11 in order to carry out the second movement of the rod 10 and therefore the adjustment of the closure member 5 between the intermediate position and the closed position, pneumatically acting piston-cylinder units 21, which are consequently referred to as transverse piston-cylinder units, serve as drives. The cylinder spaces of the transverse piston-cylinder units 21 are integrated in the door housing 25. For this purpose, the housing part 22 of the door housing 25 has corresponding recesses 23 which form cylinder spaces and are closed by cover parts 24. Pistons 26 of the transverse piston-cylinder units 21 are accommodated in said cylinder spaces. The piston rods 27 of said transverse piston-cylinder units pass through bores 28 in an intermediate wall of the housing part 22 in a sealed manner (by elastic seals) and are rigidly connected to the piston rods 20. The pistons and the piston rods 27 are mounted here so as to be displaceable from the walls of the cylinder spaces and from the intermediate wall of the housing part 22 in the direction of the second movement of the rod 20.

A different design and/or arrangement of the transverse piston-cylinder units 21 is conceivable and possible, wherein the cylinders of the transverse piston-cylinder units 21 could also be parts which are separate from the door housing 25. Only one transverse piston-cylinder unit 21 or more than two transverse piston-cylinder units 21 could also be provided.

In order to close the door from its open state, first of all the rod 10 is displaced axially by the longitudinal piston-cylinder units 12, wherein the transmission piece 17 is guided in a linearly displaceable manner by the guide rods 20 in the direction of the longitudinal axis 11 of the rod 10. When the closure member 5 has reached the intermediate position, the transmission piece 17 and therefore the rod 10 are displaced at an angle, preferably at a right angle to the longitudinal axis 11 by actuation of the transverse piston-cylinder units 21, in order to carry out the second movement of the rod 10, as a result of which the closure member 5 is adjusted from the intermediate position into the closed position.

The transmission piece 17 and the guide rods 20 therefore form bearing elements, by which the rod 10 is mounted movably over its first movement in relation to the door housing 25. The walls of the cylinder spaces, the bores 28 in the intermediate wall of the housing part 22, the pistons 26 and the piston rods 27 of the transverse piston-cylinder units 21 form bearing elements, by means of which the rod 10 is mounted movably over its second movement in relation to the door housing 25.

On the side opposite the recesses 23 in the housing part 22, the housing part 22 is of shell-shaped design and is closed by a plate-like housing part 29.

The housing part 22 has a through opening 34 which extends in the longitudinal direction of the rod 10 and is closed by a further plate-like housing part 35. This through opening 34 accommodates that end of the rod 10 which is remote from the closure member 5. In the closed state of the door, lateral continuations 36 of the rod 10 are supported on edges of extensions 34a on the side which is directed toward the chamber wall 2 and has the through opening 34 laterally.

A portion of the rod 10 adjoining that end of the rod 10 at which the rod 10 is connected to the closure member 5 extends through a further through opening 32 in the housing part 22, said through opening extending in the longitudinal direction of the rod 10.

The housing parts 22, 24, 29, 35 are sealed off from one another by seals located in between.

A door housing 25 which encloses an interior space 30 is formed by the outer walls of the housing part 22 and the housing parts 24, 29 and 35. The bearing elements, by which the rod is mounted movably over its first movement and over its second movement in relation to the door housing 25, are located in said interior space 30.

The rod 10 is guided, in a manner sealed against an escape of particles, out of the interior space 30 of the door housing 25 into the surrounding space 45 surrounding the door housing 25. For this purpose, use is made of a bellows 31 (not illustrated in detail over its entire length in the figures) which is designed, for example, in the form of an expansion bellows, especially a diaphragm bellows. Use of bellows designed in another manner, for example corrugated bellows, is conceivable and possible. The bellows 31 is connected at the one end to the rod 10 and at the other end to the housing part 22, specifically in the region of the through opening 32 for the rod 10. The interior space of the door housing 25 therefore continues through the intermediate space, which is located between the bellows 31 and the rod 10, as far as the connecting region between the bellows 31 and the rod 10.

The longitudinal piston-cylinder units 12 including their piston rods 16 are located over their entire extent, and the transverse piston-cylinder units 21 including their piston rods 27 are located over their entire extent, in the interior space 30 of the door housing 25.

Compressed air is supplied to the piston-cylinder units 12, 21 through ports 37, 38. Passages which lead to the corresponding cylinder spaces can be formed by bores, for example in the housing part 22 and/or by a hose line and/or by pipes. For the sake of clarity, these means of supplying compressed air to the piston-cylinder units 12, 21 are not illustrated in the figures, any more than control valves and position indicators which ensure the correct sequence of operation of the piston-cylinder units 12, 21. Corresponding sequence control units are known.

In addition, there is a port 39 which leads to a passage 41 which passes through a housing wall 40 and therefore communicates with the interior space 30 of the door housing 25. In the operating state of the door, a line 42 which is connected to a vacuum pump 44 is connected to said port. The line 42 and the vacuum pump 44 are only shown schematically in FIGS. 3 and 12. The interior space 30 of the door housing 25 is therefore evacuated by the passage 41 and the passage 43 leading through the line 42.

The interior space 30 of the door housing 25 is sealed in relation to the surrounding space 45 which surrounds the door housing 25. Changes to the free volume in the interior space 30 of the door housing 25, which changes arise through positional changes of the parts during the opening and closing of the door, in particular by the bellows 31 being pulled apart and pressed together, are possible without the formation of a positive pressure in relation to atmospheric pressure, since the interior space 30 is under vacuum.

The door housing 25 has an abutment region in which it abuts against the chamber wall 2 in the state fastened thereto. This abutment region is located in the vicinity of fastening screws 14 and is formed by elevations 15 of the housing part 22. In the region of said elevations, the housing part 29 can have cutouts. In a region positioned further away from the fastening screws 14 in relation to the abutment region, the door housing 25 is spaced apart from the chamber wall 2 by a gap 64. Small positional changes in relation to the chamber wall 2 brought about by deformations of the door housing, said positional changes occurring primarily in a region remote from the fastening screws 14, thereby lead to a lower production of particles than in a design in which the door housing 25 abuts continuously against the chamber wall 2.

A second exemplary embodiment of the invention is illustrated in FIGS. 16 to 31. Apart from the differences described below, the design of the second exemplary embodiment corresponds to that of the first exemplary embodiment, and the description of the first exemplary embodiment and the possible modifications is also applicable to this extent to the second exemplary embodiment.

The substantial difference of the second exemplary embodiment over the first exemplary embodiment consists in that the second movement of the rod 10 consists in pivoting of the rod 10 about a pivot axis 46 which is at a right angle to the rod 10. The longitudinal piston-cylinder units 12 act here on both sides of the rod 10 on a yoke 47 which is mounted on the rod 10 so as to be displaceable in the direction of the longitudinal axis 11 of the rod 10. The yoke 47 has laterally protruding pins 48 which are guided in slotted guide tracks 49 which are arranged on the inner sides of the housing walls 50, 51.

Secured on the rod 10 is a guide piece 52 which has pins 53 which protrude on both sides and engage in guide tracks 54 in intermediate walls 55, 56 in the interior of the door housing 25. A helical spring 57 surrounding the rod 10 is located between the guide piece 52 and the yoke 47.

In order to adjust the closure member from the open position (FIGS. 16-22) via the intermediate position (FIGS. 23-26) into the closed position (FIGS. 27-30), use is made of the longitudinal piston-cylinder units 12 arranged in the interior space 30 of the door housing 25. This longitudinal piston-cylinder units displace the yoke 47, with the movement of the yoke 47 being transmitted to the guide piece 52 via the helical spring 57. In the process, the pins 53 of the guide piece 52 move along the rectilinearly running guide tracks 54, and the pins 48 of the yoke 47 move along rectilinearly running portions of the slotted guide tracks 49 until the closure member 5 reaches the intermediate position. When the intermediate position of the closure member 5 is reached, the pins 53 reach the ends of the guide tracks 54, and therefore a further movement of the guide piece 52 is blocked. The yoke 47 is moved further in the same direction by the longitudinal piston-cylinder units 12, the yoke being displaced in relation to the rod 10 by compression of the helical spring 57. The pins 48 of the yoke 47 move here along portions of the slotted guide tracks 49 which have a curved profile and can be seen in particular from FIGS. 21 and 25, and the rod 10 is thus pivoted about the pivot axis 46 until the closure member 5 reaches the closed position.

In this exemplary embodiment, the pins 48, the slotted guide tracks 49, the pins 53 and the guide tracks 54 form the bearing elements, by which the rod 10 is mounted movably over its first movement and over its second movement in relation to the door housing 25.

The yoke 47 could also be fastened rigidly to the rod 10 and the helical spring 57 could therefore be omitted. The curved profile of the slotted guide tracks 49 would then start even before the pins 30 reach the ends of the guide tracks 54. As a result, a J-shaped movement of the closure member could be formed.

The J-shaped movement of the closure member could also be achieved without pivoting of the rod 10 in that both the slotted guide track 49 and the guide track 54 have end portions running obliquely in the direction of the chamber wall 2. The movement between the yoke 42 and the piston rods of the longitudinal piston-cylinder units 12 with respect to the direction parallel to the longitudinal center axis 6 of the chamber opening 4 would then have to be made possible, for example in an analogous manner as described in the first exemplary embodiment.

Other mechanisms for forming L- or J-shaped movements of the closure member 5 are conceivable and possible. Such mechanisms are known from vacuum valves having L- or J-shaped movements of closure members arranged in valve housings.

Figure 32:
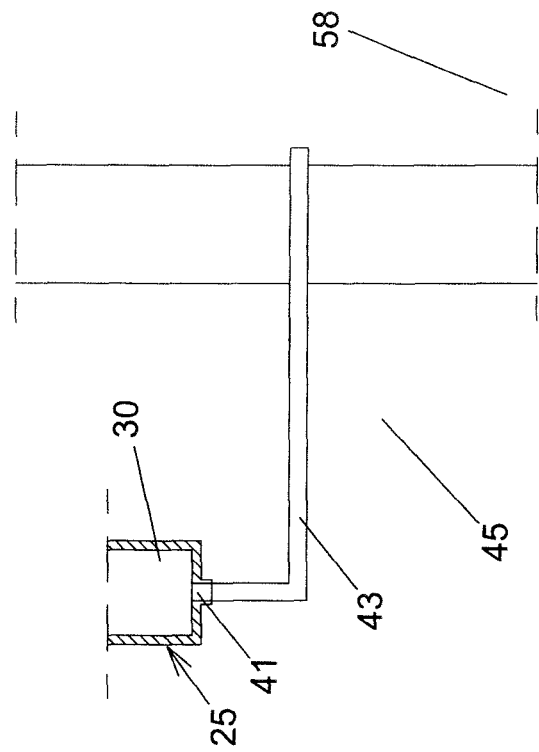
Figure 31:
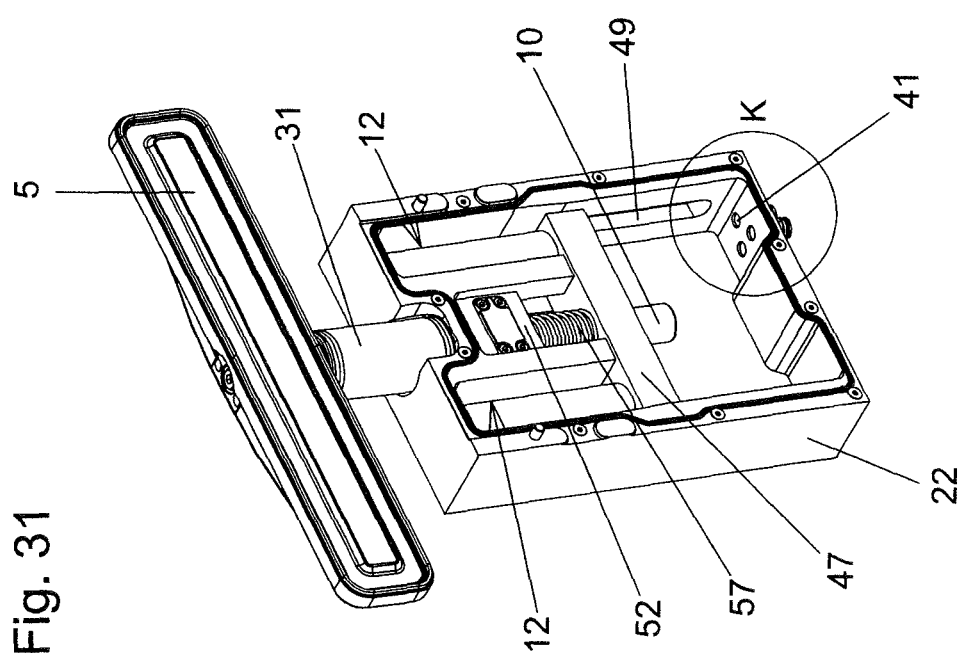
FIG. 31 shows a perspective view of the door according to the second exemplary embodiment, with a housing part having been removed.

Instead of evacuating the interior space 30 of the door housing 25, a passage 41 passing through the housing wall could also be connected via the inner passage 43 of a pipe or hose line to an exterior space 58 which is separated from the surrounding space 45 surrounding the door housing 25, as is illustrated schematically in FIG. 32. The interior space 30 of the door housing 25 is in turn sealed here in relation to the surrounding space 45.

According to a further possible variant embodiment which is illustrated schematically in FIG. 33, although the interior space 30 is not sealed in relation to the surrounding space 45, it is connected to the surrounding space 45 only via a passage 41 which passes through a housing wall 40 of the door housing 25 and in which a particle filter 59 is arranged. If the door 1 is opened from its closed state, the changing volume of the interior space 30, in particular because of the compression of the bellows 31, causes air to be displaced out of the interior space 30 through the passage 41. The particle loading of the air is at least substantially reduced here by the particle filter 59. In addition, remaining particles are released in a region located further away from the chamber opening 4.

A further variant embodiment is illustrated schematically in FIG. 34. In this exemplary embodiment, the interior space 30 of the door housing 25 is completely closed (encapsulated). In order to be able to accommodate changes in volume during the opening and closing of the door, such that the pressure in the interior space 30 does not change too severely, an expansion vessel 60 is arranged in the interior space of the door housing 25 in this exemplary embodiment. This expansion vessel has an expansion space 61, the volume of which can change. For this purpose, in the exemplary embodiment, the expansion vessel 60 is designed in the manner of an expandable balloon. The expansion space 61 is connected to the surrounding space 45 via a passage 62. The expansion vessel could also have, for example, a rigid movable wall.

The expansion vessel 60 could also be arranged outside the door housing 25 and could be connected to the interior space 30 of the door housing 25 via a passage 63, cf. schematic FIG. 35. Otherwise, the interior space 30 of the door housing 25 is completely closed.

KEY TO THE REFERENCE NUMBERS

1 Door
2 Chamber wall
3 Vacuum chamber
4 Chamber opening

5 Closure member
6 Longitudinal center axis
7 Seal
8 Sealing face
9 Connecting piece
10 Rod
11 Longitudinal axis
12 Longitudinal piston-cylinder unit
13 Cylinder
14 Fastening screw
15 Elevation
16 Piston rod
17 Transmission piece
18 Connecting part
19 Recess
20 Guide rod
21 Transverse piston-cylinder unit
22 Housing part
23 Recess
24 Housing part
25 Door housing
26 Piston
27 Piston rod
28 Bore
29 Housing part
30 Interior space
31 Bellows
32 Through opening
33 Block
34 Through opening
34a Extension
35 Housing part
36 Continuation
37 Port
38 Port
39 Port
40 Housing wall
41 Passage
42 Line
43 Passage
44 Vacuum pump
45 Surrounding space
46 Pivot axis
47 Yoke
48 Pin
49 Slotted guide track
50 Housing wall
51 Housing wall
52 Guide piece
53 Pin
54 Guide track
55 Intermediate wall
56 Intermediate wall
57 Helical spring
58 Exterior space
59 Particle filter
60 Expansion vessel
61 Expansion space
62 Passage
63 Passage
64 Gap

The invention claimed is:

1. A door for closing a chamber opening in a chamber wall of a vacuum chamber in relation to a surrounding space in which the vacuum chamber is located, comprising
a door housing arranged in the surrounding space,
a closure member which is arranged in the surrounding space and is adjustable over an adjustment path from an open position for opening up the chamber opening into a closed position for closing the chamber opening,
and a rod which has a longitudinal axis and to which the closure member is connected, wherein the closure member is adjusted over the adjustment path by a first movement of the rod and a subsequent second movement of the rod, and the first movement of the rod, by which the closure member is adjusted from the open position into an intermediate position, is a displacement of the rod in a direction of the longitudinal axis, and the subsequent second movement of the rod, by which the closure member is adjusted from the intermediate position into the closed position, is at least one of a displacement of the rod in a direction at an angle to the longitudinal axis or a pivoting of the rod about a pivot axis which is at a right angle to the longitudinal axis, the rod is mounted movably over the first movement and over the second movement in relation to the door housing by bearing elements, said bearing elements, by which the rod is mounted movably over the first movement and over the second movement in relation to the door housing, are arranged in an interior space of the door housing, and the rod is guided out of said interior space into the surrounding space in a sealed manner,
wherein said interior space is sealed in relation to the surrounding space and said interior space is evacuated via a passage passing through a housing wall of the door housing.

2. The door as claimed in claim 1, wherein at least one pneumatic piston-cylinder unit which has a piston with a piston rod attached thereto is completely arranged in the interior space of the door housing.

3. The door as claimed in claim 2, wherein there are at least two of the pneumatic piston-cylinder units and both the first movement of the rod and the second movement of the rod are drivable by the pneumatic piston-cylinder units which have pistons and piston rods attached to the pistons, and all of the piston-cylinder units moving the rod are completely arranged in the interior space of the door housing.

4. The door as claimed in claim 1, wherein a circumferentially closed seal is arranged on the closure member, said seal, in the closed position of the closure member, is pressed against a sealing face surrounding the chamber opening, or a circumferentially closed sealing face is arranged on the closure member, said sealing face, in the closed position of the closure member, is pressed against a seal which is arranged on the chamber wall and surrounds the chamber opening.

5. The door as claimed in claim 1, further comprising bellows, and the rod is led out of the interior space of the door housing in a manner sealed by the bellows.

6. A door for closing a chamber opening in a chamber wall of a vacuum chamber in relation to a surrounding space in which the vacuum chamber is located, comprising
a door housing arranged in the surrounding space,
a closure member which is arranged in the surrounding space and is adjustable over an adjustment path from an open position for opening up the chamber opening into a closed position for closing the chamber opening,
and a rod which has a longitudinal axis and to which the closure member is connected, wherein the closure member is adjusted over the adjustment path by a first movement of the rod and a subsequent second movement of the rod, and the first movement of the rod, by which the closure member is adjusted from the open position into an intermediate position, is a displacement of the rod in a direction of the longitudinal axis, and the subsequent second movement of the rod, by which the closure member is adjusted from the intermediate position into the closed position, is at least one of a displacement of the rod in a direction at an angle to the longitudinal axis or a pivoting of the rod about a pivot axis which is at a right angle to the longitudinal axis, the rod is mounted movably over the first movement and over the second movement in relation to the door housing by bearing elements, said bearing elements, by which the rod is mounted movably over the first movement and over the second movement in relation to the door housing, are arranged in an interior space of the door housing, and the rod is guided out of said interior space into the surrounding space in a sealed manner, wherein said interior space is connected to the surrounding space only via a passage which passes through a housing wall of the door housing and in which a particle filter is arranged and said interior space is otherwise sealed from the surrounding space.

7. A door for closing a chamber opening in a chamber wall of a vacuum chamber in relation to a surrounding space in which the vacuum chamber is located, comprising a door housing arranged in the surrounding space, a closure member which is arranged in the surrounding space and is adjustable over an adjustment path from an open position for opening up the chamber opening into a closed position for closing the chamber opening, and a rod which has a longitudinal axis and to which the closure member is connected, wherein the closure member is adjusted over the adjustment path by a first movement of the rod and a subsequent second movement of the rod, and the first movement of the rod, by which the closure member is adjusted from the open position into an intermediate position, is a displacement of the rod in a direction of the longitudinal axis, and the subsequent second movement of the rod, by which the closure member is adjusted from the intermediate position into the closed position, is at least one of a displacement of the rod in a direction at an angle to the longitudinal axis or a pivoting of the rod about a pivot axis which is at a right angle to the longitudinal axis, the rod is mounted movably over the first movement and over the second movement in relation to the door housing by bearing elements, said bearing elements, by which the rod is mounted movably over the first movement and over the second movement in relation to the door housing, are arranged in an interior space of the door housing, and the rod is guided out of said interior space into the surrounding space in a sealed manner, wherein said interior space is sealed in relation to the surrounding space and said interior space is connected via a passage passing through a housing wall of the door housing to an exterior space which is separate from the surrounding space in which the door housing is arranged.

8. A door for closing a chamber opening in a chamber wall of a vacuum chamber in relation to a surrounding space in which the vacuum chamber is located, comprising a door housing arranged in the surrounding space, a closure member which is arranged in the surrounding space and is adjustable over an adjustment path from an open position for opening up the chamber opening into a closed position for closing the chamber opening, and a rod which has a longitudinal axis and to which the closure member is connected, wherein the closure member is adjusted over the adjustment path by a first movement of the rod and a subsequent second movement of the rod, and the first movement of the rod, by which the closure member is adjusted from the open position into an intermediate position, is a displacement of the rod in a direction of the longitudinal axis, and the subsequent second movement of the rod, by which the closure member is adjusted from the intermediate position into the closed position, is at least one of a displacement of the rod in a direction at an angle to the longitudinal axis or a pivoting of the rod about a pivot axis which is at a right angle to the longitudinal axis, the rod is mounted movably over the first movement and over the second movement in relation to the door housing by bearing elements, said bearing elements, by which the rod is mounted movably over the first movement and over the second movement in relation to the door housing, are arranged in an interior space of the door housing, and the rod is guided out of said interior space into the surrounding space in a sealed manner, wherein said interior space is sealed in relation to the surrounding space and in order to compensate changes of a volume of said interior space in the process of opening and closing the door, an expansion vessel with an inner expansion space, a volume of which is changeable, is provided, wherein the expansion vessel is arranged in said interior space, which is completely closed, or is arranged in the surrounding space, in which the door housing is located, and is connected to said interior space via a passage passing through a housing wall of the door housing.

9. A door for closing a chamber opening in a chamber wall of a vacuum chamber in relation to a surrounding space in which the vacuum chamber is located, comprising a door housing arranged in the surrounding space, a closure member which is arranged in the surrounding space and is adjustable over an adjustment path from an open position for opening up the chamber opening into a closed position for closing the chamber opening, and a rod which has a longitudinal axis and to which the closure member is connected, wherein the closure member is adjusted over the adjustment path by a first movement of the rod and a subsequent second movement of the rod, and the first movement of the rod, by which the closure member is adjusted from the open position into an intermediate position, is a displacement of the rod in a direction of the longitudinal axis, and the subsequent second movement of the rod, by which the closure member is adjusted from the intermediate position into the closed position, is at least one of a displacement of the rod in a direction at an angle to the longitudinal axis or a pivoting of the rod about a pivot axis which is at a right angle to the longitudinal axis, the rod is mounted movably over the first movement and over the second movement in relation to the door housing by bearing elements, said bearing elements, by which the rod is mounted movably over the first movement and over the second movement in relation to the door housing, are arranged in an interior space of the door housing, and the rod is guided out of said interior space into the surrounding space in a sealed manner, wherein said interior space is sealed in relation to the surrounding space or is connected to the surrounding space via a passage which passes through a housing wall of the door housing and in which a particle filter is arranged, and wherein in a region in which the door housing is fastenable to the chamber wall via fastening screws, the door housing has elevations for abutment against the chamber wall and, in a region located further away from the fastening screws than the elevations, the door housing is recessed in relation to the elevations in order to form a gap between the door housing and the chamber wall.

* * * * *